United States Patent
Sugawara et al.

(10) Patent No.: US 7,926,543 B2
(45) Date of Patent: Apr. 19, 2011

(54) METHOD FOR PRODUCING METAL/CERAMIC BONDING SUBSTRATE

(75) Inventors: Akira Sugawara, Iwata (JP); Takayuki Takahashi, Shiojiri (JP)

(73) Assignee: Dowa Metaltech Co., Ltd, Tokyo (JP)

( * ) Notice: Subject to any disclaimer, the term of this patent is extended or adjusted under 35 U.S.C. 154(b) by 168 days.

(21) Appl. No.: 11/729,221

(22) Filed: Mar. 28, 2007

(65) Prior Publication Data

US 2007/0227685 A1 Oct. 4, 2007

(30) Foreign Application Priority Data

Mar. 31, 2006 (JP) .................... 2006-099358
Mar. 9, 2007 (JP) .................... 2007-059364

(51) Int. Cl.
*B22D 19/00* (2006.01)
(52) U.S. Cl. .............................. 164/98; 164/125
(58) Field of Classification Search .......... 164/98, 164/125
See application file for complete search history.

(56) References Cited

U.S. PATENT DOCUMENTS

| 5,194,202 | A * | 3/1993 | Yun et al. ................ 148/538 |
| 5,614,043 | A * | 3/1997 | Ritland et al. .......... 156/89.18 |
| 5,899,256 | A * | 5/1999 | Rohatgi ................... 164/97 |
| 6,360,809 | B1 * | 3/2002 | Cornie et al. ............ 164/65 |
| 2004/0123968 | A1 * | 7/2004 | Osanai et al. .......... 164/98 |
| 2005/0072547 | A1 * | 4/2005 | Osanai et al. .......... 164/98 |
| 2005/0079329 | A1 * | 4/2005 | Osanai et al. .......... 428/195.1 |

FOREIGN PATENT DOCUMENTS

| JP | 2002-76551 | 3/2002 |
| JP | 2005-74434 | 3/2005 |

* cited by examiner

*Primary Examiner* — Jessica L Ward
*Assistant Examiner* — Nicholas P D'Aniello
(74) *Attorney, Agent, or Firm* — Bachman & LaPointe, P.C.

(57) ABSTRACT

After a molten metal of aluminum or an aluminum alloy having a temperature, which is higher than the liquidus line temperature of aluminum or the aluminum alloy by 5 to 200° C., is injected into a mold, when the mold is cooled to solidify the molten metal, the molten metal injected into the mold is pressurized at a pressure of 1.0 to 100 kPa from a high-temperature side to a low-temperature side, and the mean cooling rate is set to be 5 to 100° C./minute while the mold is cooled from the liquidus line temperature to 450° C., the temperature gradient formed in the mold being set to be in the range of from 1° C./cm to 50° C./cm.

9 Claims, 2 Drawing Sheets

METHOD FOR PRODUCING METAL/CERAMIC BONDING SUBSTRATE

BACKGROUND OF THE INVENTION

1. Field of the Invention

The present invention generally relates to a method for producing a metal/ceramic bonding substrate. More specifically, the invention relates to a method for producing a metal/ceramic bonding substrate, wherein a metal member of aluminum or an aluminum alloy is bonded to a ceramic substrate, by cooling and solidifying a molten metal of aluminum or the aluminum alloy injected into a mold in which a ceramic substrate is arranged.

2. Description of the Prior Art

In a conventional power module used for controlling heavy-current for electric vehicles, electric railcars, machine tools and so forth, a metal/ceramic insulating substrate is fixed to one side of a metal plate or compound material called base plate by soldering, and semiconductor chips are fixed to the metal/ceramic insulating substrate by soldering. On the other side (reverse) of the base plate, a radiating fin or cooling jacket of a metal is mounted via a thermal conduction grease by means of screws.

Since the soldering of the base plate and semiconductor chips to the metal/ceramic insulating substrate is carried out by heating, the base plate is easy to warp due to the difference in coefficient of thermal expansion between bonded members during soldering. In addition, heat generated from the semiconductor chips passes through the metal/ceramic insulating substrate, solder and base plate to be radiated from the radiating fin or cooling jacket to air or cooling water. Therefore, if the base plate warps during soldering, when the radiating fin or cooling jacket is mounted on the base plate, the clearance therebetween increases, so that the heat sink characteristic of the base plate extremely deteriorates. Moreover, since the thermal conductivity of solder itself is low, it is desired that a power module for allowing the flow of heavy-current has a higher heat sink characteristic. In order to solve these problems, there is proposed a metal/ceramic circuit board wherein a base plate of aluminum or an aluminum alloy is bonded directly to a ceramic substrate without soldering between the base plate and a metal/ceramic insulating substrate (see, e.g., Japanese Patent Laid-Open No. 2002-76551). As a mold for producing such a metal/ceramic bonding substrate, there is proposed a mold in which a cavity (a base plate forming portion) for forming a base plate is formed, the bottom face of the cavity having a plurality of recessed portions (ceramic substrate housing portions) for housing therein ceramic substrates, and the bottom face of each of the recessed portions having a recessed portion (a metal plate forming portion for circuit pattern) for forming a metal plate for circuit pattern (see, e.g., Japanese Patent Laid-Open No. 2005-74434).

However, if a metal/ceramic bonding substrate is produced by means of such a mold in which a cavity or recessed portion corresponding to the shape and size of a metal plate (a base plate or a metal plate for circuit pattern) to be bonded to a ceramic substrate is formed, when a molten metal of aluminum or an aluminum alloy is solidified by cooling the mold after the molten metal is injected into the mold, there are some cases where the amount of the supplied molten metal is insufficient for solidification and shrinkage to easily cause the so-called "shrinkage cavities" and/or "voids" in the metal member of aluminum or the aluminum alloy of the produced metal/ceramic bonding substrate, so that the metal member has an undesired shape to deteriorate the reliability of the metal/ceramic bonding substrate. For example, there are some cases where the corner portions of a base plate are rounder than a desired shape if the base plate is bonded to a ceramic substrate, or where the corner portions of fins are rounder than a desired shape if a base plate with fins are bonded to a ceramic substrate. In addition, if the metal member is made of an aluminum alloy, there are some cases where hot cracks are produced in the metal member in a cooling process to deteriorate the reliability of a metal/ceramic bonding substrate.

SUMMARY OF THE INVENTION

It is therefore an object of the present invention to eliminate the aforementioned problems and to provide a method for producing a metal/ceramic bonding substrate, which can prevent defects, such as shrinkage cavities and voids, from being caused to produce a reliable metal/ceramic bonding substrate, in a method for bonding a metal member of aluminum or an aluminum alloy to a ceramic substrate to produce a metal/ceramic bonding substrate by solidifying a molten metal of aluminum or the aluminum alloy by cooling a mold into which the molten metal is injected from an inlet so as to contact the ceramic substrate after the ceramic substrate is set in the mold.

In order to accomplish the aforementioned and other objects, the inventors have diligently studied and found that it is possible to prevent defects, such as shrinkage cavities and voids, from being caused to produce a reliable metal/ceramic bonding substrate, if a molten metal of aluminum or an aluminum alloy is solidified by cooling a mold while pressurizing the molten metal injected into the mold, in a method for bonding a metal member of aluminum or an aluminum alloy to a ceramic substrate to produce a metal/ceramic bonding substrate by solidifying a molten metal of aluminum or the aluminum alloy by cooling a mold into which the molten metal is injected from an inlet so as to contact the ceramic substrate after the ceramic substrate is set in the mold. Thus, the inventors have made the present invention.

According one aspect of the present invention, there is provided a method for producing a metal/ceramic bonding substrate, the method comprising the steps of: setting a ceramic substrate in a mold having an inlet; injecting a molten metal of aluminum or an aluminum alloy into the mold from the inlet so as to allow the molten metal to contact the ceramic substrate; and solidifying the molten metal to bond a metal member of aluminum or the aluminum alloy to the ceramic substrate by cooling the mold while pressurizing the molten metal injected into the mold.

In this method for producing a metal/ceramic bonding substrate, the molten metal is preferably solidified by cooling a part of the mold to form a high-temperature side and a low-temperature side in the mold and by cooling the mold while the molten metal injected into the mold is pressurized from the high-temperature side to the low-temperature side. Alternatively, the molten metal is preferably solidified by cooling the mold so that the inlet side in the mold is a high-temperature side and the opposite side in the mold to the inlet (the far side from the inlet, e.g., the bottom side of the mold when the inlet is formed on the upper face side of the mold) is a low-temperature side, the temperature on which is lower than that on the high-temperature side, and by cooling the mold while the molten metal injected into the mold is pressurized from the high-temperature side to the low-temperature side. The molten metal is preferably pressurized at a pressure of 1.0 to 100 kPa when the mold is cooled. The molten metal injected into the mold preferably has a temperature which is higher than the liquidus line temperature of the molten metal by 5 to 200° C. The molten metal is preferably cooled at a mean cooling rate of 5 to 100° C./minute while being cooled from the liquidus line temperature of the molten metal to 450° C. When the mold is cooled, a temperature gradient of 1 to 50° C./cm is preferably formed in the mold. Before injecting the molten metal into the mold, the mold is preferably heated so that the difference between the temperature of the mold and the temperature of the molten metal is not higher than 250° C. The molten metal may be pressurized from the inlet, or from an opening formed in the mold. The aluminum alloy preferably contains silicon.

According to the present invention, it is possible to prevent defects, such as shrinkage cavities and voids, from being caused to produce a reliable metal/ceramic bonding substrate, in a method for bonding a metal member of aluminum or an aluminum alloy to a ceramic substrate to produce a metal/ceramic bonding substrate by solidifying a molten metal of aluminum or the aluminum alloy by cooling a mold into which the molten metal is injected from an inlet so as to contact the ceramic substrate after the ceramic substrate is set in the mold.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 1:
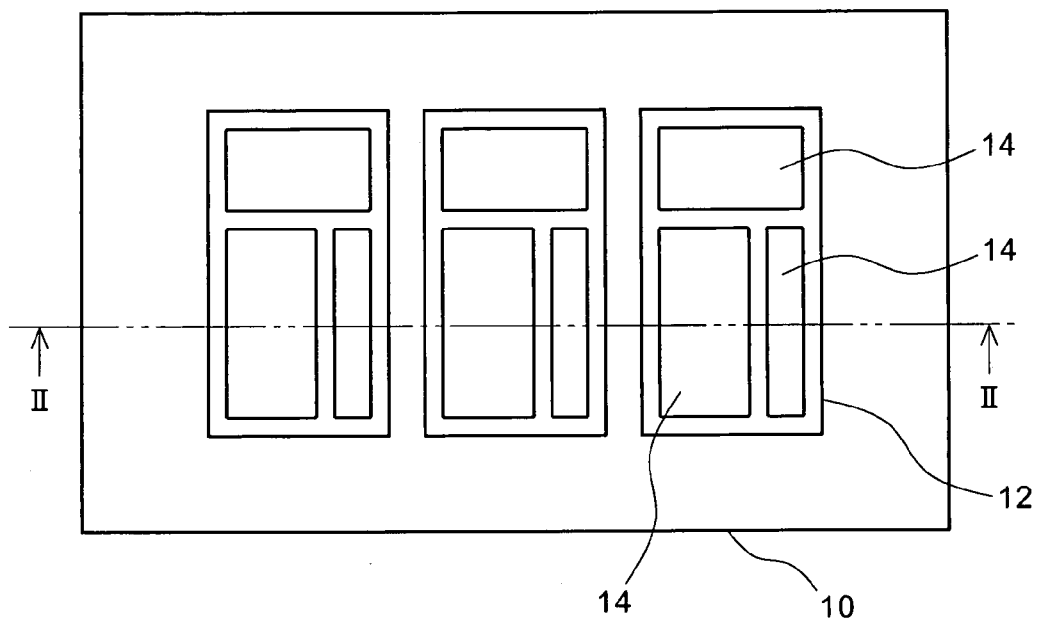
FIG. 1 is a plan view of a metal/ceramic circuit board produced in examples and comparative examples.
Figure 2:
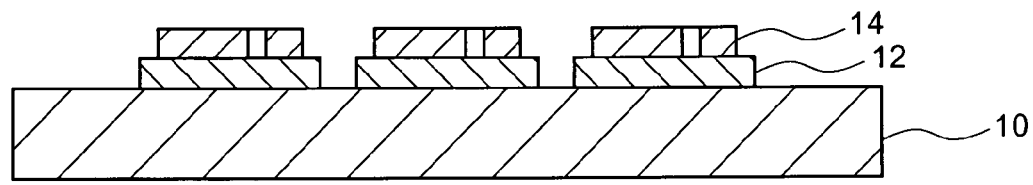
FIG. 2 is a sectional view taken along line II-II of FIG. 1.

In the preferred embodiment of a method for producing a metal/ceramic bonding substrate according to the present invention, a molten metal of aluminum or an aluminum alloy is solidified by cooling a mold while pressurizing the molten metal injected into the mold, in a method for bonding a metal member of aluminum or an aluminum alloy to a ceramic substrate to produce a metal/ceramic bonding substrate by solidifying a molten metal of aluminum or the aluminum alloy by cooling a mold into which the molten metal is injected from an inlet so as to contact the ceramic substrate after the ceramic substrate is set in the mold.

In the method for producing a metal/ceramic bonding substrate in this preferred embodiment, the pressurization to the molten metal during the cooling of the mold may be carried out by blowing nitrogen gas or the like into an inlet (or an opening for feeder head) from a gas pressurizing nozzle, or by inserting a piston into an inlet (or an opening for feeder head) to push the molten metal into the mold. Alternatively, the pressurization to the molten metal during the injection of the molten metal into the mold may be maintained as it is, or the pressurization to the molten metal may be carried out when the mold is cooled to solidify the molten metal after the pressurization to the molten metal during the injection of the molten metal into the mold is stopped once.

The molten metal is preferably solidified by cooling a part of the mold to form a high-temperature side (a high-temperature zone side) and a low-temperature side (a low-temperature zone side) and by cooling the mold while the molten metal injected into the mold is pressurized from the high-temperature side to the low-temperature side. Alternatively, the molten metal is preferably solidified by cooling the mold so that the inlet side in the mold is a high-temperature side and the opposite side in the mold to the inlet is a low-temperature side and by cooling the mold while the molten metal injected into the mold is pressurized from the high-temperature side to the low-temperature side. When the molten metal is cooled, if the molten metal is pressurized from the high-temperature side to the low-temperature side, i.e., if the molten metal is pressurized in the opposite direction to the solidifying direction, an unsolidified part of the molten metal on the high-temperature side is smoothly supplied to a shrinking portion of the molten metal solidified on the low-temperature side, so that a metal/ceramic bonding substrate having no shrinkage cavity can be finally obtained. If the mold is cooled so that the inlet side in the mold is a high-temperature side and the opposite side in the mold to the inlet is a low-temperature side, the temperature on which is lower than that on the inlet side, the structure of the mold and apparatus for producing a metal/ceramic bonding substrate can be simplified. Furthermore, the molten metal may be pressurized from the inlet or from an opening formed in the mold in addition to the inlet.

The pressure applied to the molten metal is preferably in the range of from 1.0 kPa to 100 kPa, more preferably in the range of from 3 kPa to 80 kPa, and most preferably in the range of from 5 kPa to 30 kPa. If the pressure is lower than 1.0 kPa, the pressurizing effect is too small, so that it is easy to cause internal defects, such as shrinkage cavities and voids. If the pressure exceeds 100 kPa, the pressure is too high, so that it is also easy to cause internal defects, such as shrinkage cavities and voids. In particular, when the mold comprises a plurality of members, if the pressure applied to the molten metal exceeds 100 kPa, there are some cases where the molten metal leaks out from the gaps or clearances between the members of the mold or from a portion of the mold contacting a pressurizing means. If the amount of the molten metal leaking out from the mold is large, the amount of the metal bonded to the ceramic substrate is insufficient, so that it is easy to cause internal defects, such as shrinkage cavities and voids. In order to increase the pressure, which is applied to the molten metal, to prevent the molten metal from leaking out from the mold, it is required to enhance the strength of each of the members of the mold and the pressurizing means, and/or it is required to improve the adhesion between the members of the mold and between the mold and the pressurizing means. Therefore, costs are increased, and there is some possibility of damaging the ceramic substrate by the excessive pressure. Furthermore, the value of the above described pressure applied to the molten metal means the value of a pressure added to the atmospheric pressure, and does not mean the value of an absolute pressure (wherein absolute vacuum is 0 kPa).

The temperature of the molten metal injected into the mold is preferably higher than the liquidus line temperature of aluminum or an aluminum alloy by a temperature of 5 to 200° C., and more preferably higher than the liquidus line temperature of aluminum or an aluminum alloy by a temperature of 20 to 200° C. When the temperature of the molten metal is lower than a temperature which is higher than the liquidus line temperature by 5° C., even if the mold is heated and/or even if the molten metal is pressurized to be pushed into the mold, the flow of the molten metal is bad. In particular, defects are easily produced in the detailed portions of a metal member, such as a metal plate for circuit pattern or a base plate. On the other hand, when the temperature of the molten metal exceeds a temperature which is higher than the liquidus line temperature by 200° C., oxidation is severely caused, or hydrogen is absorbed, so that there is some possibility of causing internal defects. In addition, there is some possibility that aluminum or the aluminum alloy reacts with the mold to be bonded thereto.

When the mold is cooled, while the molten metal is cooled from the liquidus line temperature thereof to 450° C., the mean cooling rate is preferably in the range of from 5° C./minute to 100° C./minute, more preferably in the range of from 10° C./minute to 50° C./minute, and most preferably in the range of from 15° C./minute to 35° C./minute. If the mean cooling rate is thus controlled while the molten metal is cooled from the liquidus line temperature to 450° C., it is possible to control the warpage of the metal/ceramic bonding substrate, and it is possible to control thermal stress between the metal member of aluminum or aluminum alloy and the ceramic substrate. If the mean cooling rate is less than 5° C./minute, there are some cases where the crystal grain size of aluminum or aluminum alloy is excessively increased. Particularly in the case of the aluminum alloy, there are some cases where the aluminum alloy excessively deposits and/or hot cracks are produced, so that productivity is bad. On the other hand, if the mean cooling rate exceeds 100° C./minute, there are some cases where cracks are produced in the ceramic substrate by thermal stress due to thermal shock. In addition, there is no room for the creep deformation of aluminum or the aluminum alloy, so that there are some cases where the metal member greatly warps without absorbing the deformation due to the difference in thermal expansion.

When the mold is cooled, the temperature gradient formed in the mold is preferably in the range of from 1° C./cm to 50° C./cm, more preferably in the range of from 2° C./cm to 30° C./cm, and most preferably in the range of from 2° C./cm to 15° C./cm. If the temperature gradient is less than 1° C./cm, it is difficult to control nucleation in solidification, so that nuclei are produced everywhere to cause solidification and shrinkage, and the passage for supplying the molten metal is blocked by the solidified metal, so that shrinkage cavities and voids are easily produced. If the temperature gradient exceeds 50° C./cm, the growth of nuclei is superior to the nucleation in solidification, so that it is easy to produce a coarse crystal grain structure extending in heat flow directions to produce a metal/ceramic bonding substrate having a low heat cycle resistance. In addition, if the temperature gradient exceeds 50° C./cm, there is a great difference in characteristics, such as thermal contraction and strength, between the high-temperature side and low-temperature side of the metal member of aluminum or aluminum alloy bonded to the ceramic substrate, so that there is some possibility of damaging the ceramic substrate bonded to the metal member. Furthermore, if the molten metal is pressurized as described above, it is possible to decrease internal defects, such as shrinkage cavities and voids, even in a relatively low temperature gradient region.

Furthermore, in order to cool the mold while controlling the cooling rate and the temperature gradient, the mold may be cooled in an atmosphere in which a temperature gradient exists, or the mold may be selectively sprayed with a cooling gas, the flow rate and temperature of which are controlled. Alternatively, the mold may be selectively caused to contact a cooling jacket, or the mold may be caused to slide on a cooling plate. In addition, the thickness and material of the mold may be locally changed to partially change the heat sink characteristic of the mold, or the whole mold may be cooled after a desired temperature gradient is previously formed in the mold before the injection of a molten metal or before the cooling of the mold. These cooling methods may be combined.

The ceramic substrate may be a ceramic substrate of an oxide, such as alumina, or a ceramic substrate of a non-oxide, such as aluminum nitride or silicon nitride.

When a metal member of aluminum is used, pure aluminum having a purity of 99.7%, 99.9% or 99.99% may be used. When a metal member of an aluminum alloy is used, an aluminum-silicon alloy or an aluminum-copper alloy may be used.

As the aluminum-silicon alloy, an aluminum-silicon-boron alloy (Al—Si—B) containing boron is preferably used. Boron has the function of decreasing the crystal grain size of an aluminum-silicon alloy to disperse silicon to prevent hot cracks from being produced in the aluminum-silicon alloy. Furthermore, the content of silicon in the aluminum-silicon-boron alloy is preferably in the range of from 0.1 wt % to 1.5 wt % and more preferably in the range of from 0.2 wt % to 1.0 wt %, and the content of boron in the aluminum-silicon-boron alloy is preferably in the range of from 0.01 wt % to 0.5 wt % and more preferably in the range of from 0.02 wt % to 0.1 wt %, in view of the thermal conductivity and electric conductivity of the metal member of the aluminum alloy, the control of the crystal grain size thereof, the flowability of the molten metal, the hardness of the aluminum alloy, costs and so forth.

Moreover, iron may be added to the aluminum-silicon-boron alloy. Iron has the function of prevent the deposition of a compound of aluminum and boron when the aluminum-silicon-boron alloy is solidified. Since the aluminum-boron compound is not removed by a usual etching process, the aluminum-boron compound remains on the ceramic substrate, and the aluminum-boron compound is plated in the subsequent plating process, so that the insulation performance between the metal circuits of the aluminum alloy is deteriorated. Furthermore, the amount of iron added to the aluminum-silicon-boron alloy is preferably in the range of from 0.005 wt % to 0.2 wt % and more preferably in the range of from 0.005 wt % to 0.1 wt %, in order to suppress the deposition of the aluminum-boron compound and in order to relatively decrease the variation in thermal conductivity, electric conductivity and hardness of the metal member of the aluminum alloy.

Figure 3:
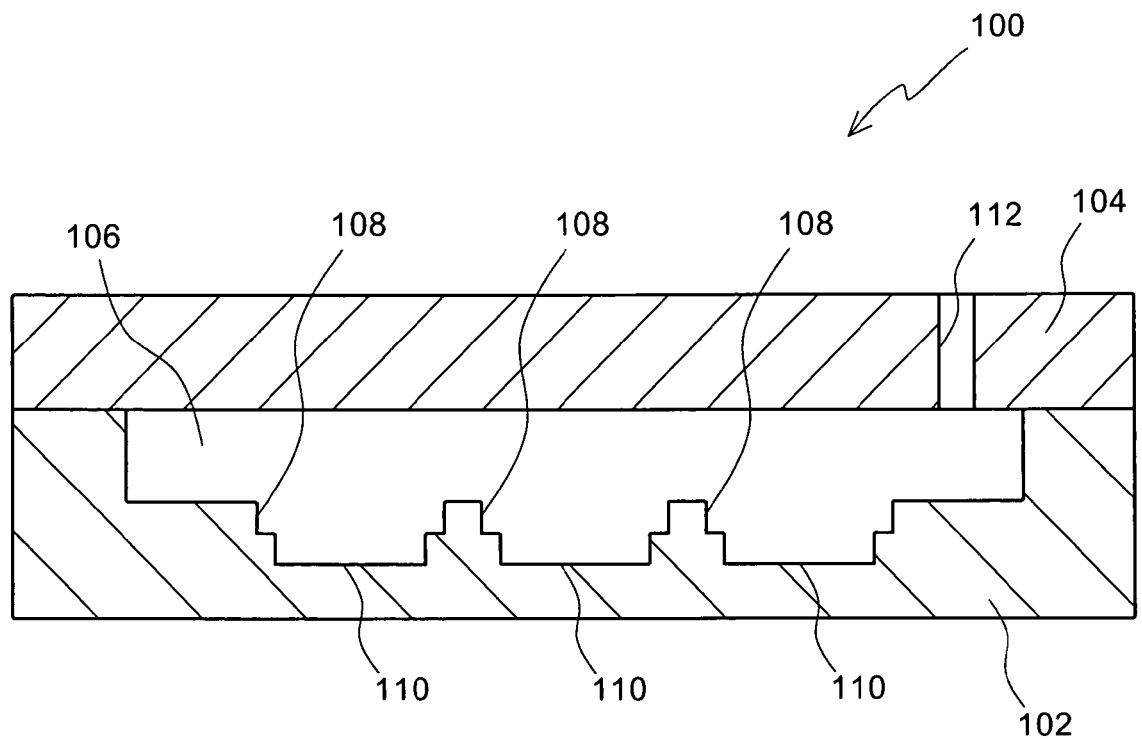
FIG. 3 is a sectional view of a mold used in the preferred embodiment of a method for producing a metal/ceramic bonding substrate according to the present invention.

As an example of a mold used in the preferred embodiment of a method for producing a metal/ceramic bonding substrate according to the present invention, a mold 100 shown in FIG. 3 may be used. The mold 100 comprises a lower mold member 102, and a substantially plate-shaped upper mold member 104 serving as a lid for closing the lower mold member 102. The bottom face of the lower mold member 102 has a cavity (a base plate forming portion) 106 for forming a base plate. The bottom face of the cavity 106 has a plurality of recessed portions (ceramic substrate housing portions) 108 for housing therein ceramic substrates. The bottom face of each of the recessed portions 108 has a recessed portion (a metal plate forming portion for circuit pattern) 110 for forming a metal plate for circuit pattern. The upper mold member 104 has an inlet 112 for injecting a molten metal into the mold 100, and a pressurizing means (not shown) can closely contact the inlet 112 to pressurize a molten metal. Furthermore, the lower mold member 102 has a molten metal passage (not shown) which extends between the base plate forming portion 106 and the metal plate forming portion for circuit pattern 110 for establishing a communication between the base plate forming portion 106 and the metal plate forming portion for circuit pattern 110 even if a ceramic substrate is housed in the ceramic substrate housing portion 108. The inlet 112 may be used as an opening for feeder head in order to prevent shrinkage cavities from being caused, or the mold 100 may have an opening (not shown) for feeder head in addition to the inlet 112.

The mold is preferably a mold of carbon which is more difficult to react with a molten metal of aluminum or an aluminum alloy than a die of a metal. In particular, the mold is preferably a porous mold of carbon so that a molten metal easily reaches end portions in the mold by allowing a remaining gas to pass through the mold while preventing the molten metal from passing through the mold even if the gas remains between the mold and the molten metal when the molten metal is pressurized.

Before the molten metal of aluminum or an aluminum alloy is injected into the mold, thermal shock during the injection of the molten metal may be decreased by previously heating the mold so that the difference between the temperature of the mold and the temperature of the molten metal is 250° C. or less, previously 150° C. or less, and more preferably 50° C. or less. If this difference exceeds 250° C., the flow of the molten metal is bad, so that shrinkage cavities and voids are easily produced. Furthermore, the temperature of the mold to be heated is preferably 800° C. or less, and more preferably 750° C. or less, in view of wear of the mold due to the reaction of aluminum or aluminum alloy with the mold and/or in view of the lowering in productivity due to the time to cool the mold and so forth.

The atmosphere in a furnace is controlled so that the concentration of oxygen in the furnace is preferably 100 ppm or less, and more preferably 10 ppm or less. If the concentration of oxygen in the furnace is too high, there are some cases where the molten metal is oxidized to increase the surface tension thereof to influence on the flow of the molten metal and wettability, and the life of the mold is shortened by oxidation and wear when the mold of carbon is used. Furthermore, the atmosphere in the furnace is preferably an atmosphere of nitrogen gas, and may be an atmosphere of argon gas or a reducing gas or in vacuum.

Since the feeder head effect due to gravity is small when a thin circuit is formed on a horizontal plate, the preferred embodiment of a method for producing a metal/ceramic bonding substrate according to the present invention is preferably applied to a case where a circuit of aluminum or an aluminum alloy having a thickness of 1 mm or less is formed on a horizontal plate, such as a ceramic substrate.

Examples of a method for producing a metal/ceramic bonding substrate according to the present invention will be described below in detail.

EXAMPLE 1

First, there was prepared a mold of carbon in which a cavity (a base plate forming portion) for forming a base plate having a size of 100 mm×150 mm×5 mm was formed, the bottom face of the cavity having three recessed portions (ceramic substrate housing portions), each of which was designed to house therein a ceramic substrate having a size of 30 mm×60 mm×0.6 mm, and the bottom face of each of the recessed portions having a recessed portion (a metal plate forming portion for circuit pattern) for forming a metal plate for circuit pattern having a size of 27 mm×57 mm×0.4 mm. This mold has an inlet for injecting a molten metal into the mold, and has a molten metal passage, which extends between the base plate forming portion and the metal plate forming portion for circuit pattern, for establishing a communication between the base plate forming portion and the metal plate forming portion for circuit pattern even if a ceramic substrate is housed in the ceramic substrate housing portion.

Then, three aluminum nitride substrates having a size of 30 mm×60 mm×0.6 mm were housed in the ceramic substrate housing portions of the mold to be put into a furnace. The atmosphere in the furnace was caused to be an atmosphere of nitrogen to decrease the concentration of oxygen to 4 ppm, and the mold was heated to 730° C. by controlling the temperature of a heater.

In addition, a previously metered molten aluminum alloy obtained by heating an aluminum alloy containing 0.4 wt % of silicon, 0.04 wt % of boron and 0.01 wt % of iron to 740° C. (a temperature higher than 657° C. being the liquidus line temperature of the aluminum alloy by 83° C.) was injected into the heated mold while removing oxide films and while applying a pressure of 10 kPa by nitrogen gas.

Then, the opposite side of the mold to the inlet was caused to contact a water-cooling jacket of copper serving as a cooling block, and nitrogen gas was blown into the inlet from a gas pressurizing nozzle, so that the molten aluminum alloy in the mold was cooled and solidified while being pressurized at a pressure of 10 kPa from the high-temperature side to the low-temperature side. Furthermore, the mean cooling rate was 22° C./minute in a temperature region of from 657° C. being the liquidus line temperature of the aluminum alloy to 450° C. The temperature gradient during cooling was adjusted to 5° C./cm by changing the contact area of the cooling block with the mold while controlling the temperature of the heater.

Thus, there was produced a metal/ceramic bonding article wherein three aluminum nitride substrates having a size of 30 mm×60 mm×0.6 mm were bonded to an aluminum alloy base plate having a size of 100 mm×150 mm×5 mm, and an aluminum alloy plate for circuit pattern having a size of 27 mm×57 mm×0.4 mm was bonded to each of the aluminum nitride substrates.

The metal/ceramic bonding article thus produced was a very good bonding article which had no shrinkage cavity and no void on the surface and interior thereof and wherein each of the corner portions of the aluminum alloy base plate had a cross section having a desired shape of R=0.1 mm or less, the warpage of the aluminum alloy base plate being small, and the maximum warpage of the aluminum alloy base plate in longitudinal directions being 0.3 mm. The mean crystal grain size on the surface of the aluminum alloy plate for circuit pattern was 0.2 to 0.3 mm.

Then, the surface of the aluminum alloy plate for circuit pattern bonded to the ceramic substrate of the metal/ceramic bonding article thus obtained was polished. Then, after an etching resist having a predetermined shape was printed on the aluminum alloy plate for circuit pattern by a screen printing machine, an etching process was carried out with ferric chloride. Thus, as shown in FIG. 1, there was produced a circuit board wherein three ceramic substrates 12 were bonded to an aluminum alloy base plate 10, aluminum alloy circuit plates 14 being bonded on each of the ceramic substrates 12 so that the distance between circuit patterns was 1.2 mm. After the surface of a portion of the ceramic substrate 12, in which the aluminum alloy melted by etching, was observed by an optical microscope (×500), it was confirmed that the amount of residual materials, such as coarse deposits, was small.

Then, on the aluminum alloy circuit plate 14 of the circuit board thus produced, a nickel-phosphorus coating having a thickness of 3 μm was formed by an electroless plating. After the adhesion of the plated portion was evaluated by a tape peeling test, the adhesion was good. Since the amount of the residual materials on the surface of the ceramic substrate 12 after etching was small, the plating deposited portion was hardly observed on the residual material, and the lowering in withstand voltage between the circuit patterns was not observed. Assuming that an alternating voltage was the withstand voltage between the circuit patterns when electric breakdown was caused by gradually applying the alternating voltage between the circuit patterns (when the leak current was 5 mA), the withstand voltage between the circuit patterns was not less than 1.4 kV.

The volume resistivity of the aluminum alloy circuit plate 14 of the circuit board was lower than 3 μΩ·cm, so that the electric conductivity thereof was good. After carrying out the heat cycle test for repeating heat cycles, in each of which the circuit board was held at a low temperature of −40° C. for 30 minutes after being held at a high temperature of 125° C. for 30 minutes, no crack was produced in the ceramic substrate after 1000 cycles, and the electrical performance, such as insulating performance, was good.

EXAMPLE 2

A metal/ceramic bonding article was produced by the same method as that in Example 1, except that the pressure applied to the molten aluminum alloy during cooling was 1 kPa. After the same evaluation as that in Example 1 was carried out with respect to the produced article, the same results as those in Example 1 were obtained, except that the cross section of each of the corner portions of the aluminum alloy base plate had R=0.2 mm (which causes no problem in practice).

EXAMPLES 3 THROUGH 5

Metal/ceramic bonding articles were produced by the same method as that in Example 1, except that the pressure applied to the molten aluminum alloy during cooling was 5 kPa (Example 3), 30 kPa (Example 4) and 90 kPa (Example 5), respectively. After the same evaluation as that in Example 1 was carried out with respect to the produced articles, the same results as those in Example 1 were obtained. Furthermore, in Example 5, the molten aluminum alloy slightly leaked from the clearance between the gas pressurizing nozzle and the mold, but there was no problem.

EXAMPLE 6

A metal/ceramic bonding article was produced by the same method as that in Example 1, except that there was used a mold capable of forming comb fins integrated with the reverse of the aluminum alloy base plate, the comb fins having a height of 10 mm, a width of 3 mm and a length of 120 mm, and being arranged at intervals of 6 mm. In this article, the cross section of each of the corner portions of both end portions of the fins had R=1 mm or less and had a desired shape. After the same evaluation as that in Example 1 was carried out except for shape with respect to the produced article, the same results as those in Example 1 were obtained.

EXAMPLE 7

A metal/ceramic bonding article was produced by the same method as that in Example 6, except that the pressure applied to the molten aluminum alloy during cooling was 1 kPa. After the same evaluation as that in Example 6 was carried out with respect to the produced article, the same results as those in Example 6 were obtained, except that the cross section of each of the corner portions of both end portions of the fins had R=3 mm (which causes no problem in practice).

EXAMPLES 8 THROUGH 10

Metal/ceramic bonding articles were produced by the same method as that in Example 6, except that the pressure applied to the molten aluminum alloy during cooling was 5 kPa (Example 8), 30 kPa (Example 9) and 90 kPa (Example 10), respectively. After the same evaluation as that in Example 6 was carried out with respect to the produced articles, the same results as those in Example 6 were obtained. Furthermore, in Example 10, the molten aluminum alloy slightly leaked from the clearance between the gas pressurizing nozzle and the mold, but there was no problem.

EXAMPLES 11 THROUGH 13

Metal/ceramic bonding articles were produced by the same method as that in Example 1, except that the temperature of the molten aluminum alloy injected into the mold was 662° C. (a higher temperature than 657° C. being the liquidus line temperature of the aluminum alloy by 5° C.) (Example 11), 680° C. (a higher temperature than 657° C. being the liquidus line temperature of the aluminum alloy by 23° C.) (Example 12), and 850° C. (a higher temperature than 657° C. being the liquidus line temperature of the aluminum alloy by 193° C.) (Example 13), respectively. After the same evaluation as that in Example 1 was carried out with respect to the produced articles, the same results as those in Example 1 were obtained.

EXAMPLE 14

A metal/ceramic bonding article was produced by the same method as that in Example 1, except that the mean cooling rate was 5° C./minute by changing the contact area of the water-cooling jacket of copper serving as the cooling block with the mold and by changing the amount of water flowing through the water-cooling jacket. After the same evaluation as that in Example 1 was carried out with respect to the produced article, the same results as those in Example 1 were obtained, except that the mean crystal grain size on the surface of the aluminum alloy plate for circuit pattern was 0.4 to 0.5 mm and that the warpage of the aluminum alloy base plate in longitudinal directions was 0.2 mm.

EXAMPLE 15

A metal/ceramic bonding article was produced by the same method as that in Example 1, except that the mean cooling rate was 95° C./minute by changing the contact area of the water-cooling jacket of copper serving as the cooling block with the mold and by changing the amount of water flowing through the water-cooling jacket. After the same evaluation as that in Example 1 was carried out with respect to the produced article, the same results as those in Example 1 were obtained, except that the mean crystal grain size on the surface of the aluminum alloy plate for circuit pattern was 0.2 mm.

EXAMPLE 16

A metal/ceramic bonding article was produced by the same method as that in Example 1, except that the temperature gradient during the cooling of the molten aluminum alloy was 1° C./cm by changing the set temperature of the heater, the contact area of the water-cooling jacket of copper with the mold, and the amount of water flowing through the water-cooling jacket. After the same evaluation as that in Example 1 was carried out with respect to the produced article, the same results as those in Example 1 were obtained.

EXAMPLE 17

A metal/ceramic bonding article was produced by the same method as that in Example 1, except that the temperature gradient during the cooling of the molten aluminum alloy was 48° C./cm by changing the set temperature of the heater, the contact area of the water-cooling jacket of copper with the mold, and the amount of water flowing through the water-cooling jacket. After the same evaluation as that in Example 1 was carried out with respect to the produced article, the same results as those in Example 1 were obtained, except that the mean crystal grain size on the surface of the aluminum alloy plate for circuit pattern was 0.2 to 0.5 mm and that there were mixed crystal grains (having a length of 5 to 15 mm) slightly extending in heat flow directions during cooling.

EXAMPLE 18 AND 19

Metal/ceramic bonding articles were produced by the same method as that in Example 1, using the same aluminum alloy, except that the content of silicon in the aluminum alloy was 0.1 wt % (Example 18) and 1.5 wt % (Example 19), respectively. After the same evaluation as that in Example 1 was carried out with respect to the produced articles, the same results as those in Example 1 were obtained. Furthermore, the liquidus line temperatures of the aluminum alloy used in Examples 18 and 19 were about 659° C. and 656° C., respectively.

EXAMPLE 20 AND 21

Metal/ceramic bonding articles were produced by the same method as that in Example 1, using the same aluminum alloy, except that the content of boron in the aluminum alloy was 0.01 wt % (Example 20) and 0.5 wt % (Example 21), respectively. After the same evaluation as that in Example 1 was carried out with respect to the produced articles, the same results as those in Example 1 were obtained. Furthermore, the liquidus line temperature of the aluminum alloy used in Examples 20 and 21 was about 657° C.

EXAMPLE 22 AND 23

Metal/ceramic bonding articles were produced by the same method as that in Example 1, using the same aluminum alloy, except that the content of iron in the aluminum alloy was 0.005 wt % (Example 22) and 0.2 wt % (Example 23), respectively. After the same evaluation as that in Example 1 was carried out with respect to the produced articles, the same results as those in Example 1 were obtained. Furthermore, the liquidus line temperature of the aluminum alloy used in Examples 22 and 23 was about 657° C.

EXAMPLE 24

A metal/ceramic bonding article was produced by the same method as that in Example 1, except that an aluminum alloy containing no boron and no iron (the content of silicon was the same as that in Example 1) was used as the aluminum alloy. In this article, although the concentration of silicon was observed in a portion in the vicinity of the inlet of the mold, the concentration of silicon, shrinkage cavities and voids were not observed in portions corresponding to an aluminum alloy base plate and aluminum alloy circuit plate, so that there was no problem. After the same evaluation as that in Example 1 was carried out with respect to the produced article, the same results as those in Example 1 were obtained, except that the mean crystal grain size on the surface of the aluminum plate for circuit pattern was 3 to 5 mm. Furthermore, the liquidus line temperature of the aluminum alloy used in Examples 24 was about 657° C.

EXAMPLE 25

A metal/ceramic bonding article was produced by the same method as that in Example 1, except that an aluminum alloy containing no iron (the contents of silicon and boron were the same as those in Example 1) was used as the aluminum alloy. After the same evaluation as that in Example 1 was carried out with respect to the produced article, the same results as those in Example 1 were obtained, except that the amount of the residual materials on the surface of the ceramic substrate after etching was larger than that in Example 1. However, the withstand voltage between the circuit patterns was not less than 1.4 kV, so that there was no problem. Furthermore, the liquidus line temperature of the aluminum alloy used in Examples 25 was about 657° C.

EXAMPLE 26

A metal/ceramic bonding article was produced by the same method as that in Example 1, except that pure aluminum (3N) was used in place of the aluminum alloy and was heated to 740° C. (a higher temperature than 660° C. being the liquidus line temperature of aluminum by 80° C.) to use molten pure aluminum. After the same evaluation as that in Example 1 was carried out with respect to the produced article, the same results as those in Example 1 were obtained, except that the mean crystal grain size on the surface of the aluminum plate for circuit pattern was 3 to 15 mm.

COMPARATIVE EXAMPLE 1

A metal/ceramic bonding article was produced by the same method as that in Example 1, except that the pressure applied to the molten aluminum alloy during cooling was 0.5 kPa. After the same evaluation as that in Example 1 was carried out with respect to the produced article, the same results as those in Example 1 were obtained, except that the cross section of each of the corner portions of the aluminum alloy base plate had R=1.0 to 1.5 mm. However, if the cross section of each of the corner portions of the aluminum alloy base plate exceeds R=1.0 mm, the alignment and sealing performance of a casing mounted on the aluminum alloy base plate are deteriorated, so that there are problems in practice.

COMPARATIVE EXAMPLE 2

A metal/ceramic bonding article was produced by the same method as that in Example 6, except that the pressure applied to the molten aluminum alloy during cooling was 0.5 kPa. After the same evaluation as that in Example 6 was carried out with respect to the produced article, the same results as those in Example 6 were obtained, except that the height of each of the fins on both ends thereof was less than 3 mm. Furthermore, if only part of the fins has a height of less than 5 mm, it is difficult to control the flow of a cooling medium after the article is assembled as a power module with cooling fins, so that the assembled power module can not be used.

COMPARATIVE EXAMPLE 3

A metal/ceramic bonding article was produced by the same method as that in Example 1, except that the pressure applied to the molten aluminum alloy during cooling was 115 kPa. When this article was produced, the molten aluminum alloy leaked out from the clearances between the gas pressurizing nozzle and the mold and between the lower mold member and the upper mold member. Thus, the amount of the aluminum alloy fell short, so that the shape of the article was greatly damaged.

COMPARATIVE EXAMPLE 4

A metal/ceramic bonding article was produced by the same method as that in Example 1, except that the temperature of the molten aluminum alloy injected into the mold was 659° C. (a higher temperature than 657° C. being the liquidus line temperature of the aluminum alloy by 2° C.). When this article was produced, the flow of the molten aluminum alloy on the side of the aluminum alloy plate for circuit pattern was insufficient, so that it was not possible to use the produced article as an insulating substrate.

COMPARATIVE EXAMPLE 5

A metal/ceramic bonding article was produced by the same method as that in Example 1, except that the temperature of the molten aluminum alloy injected into the mold was 900° C. (a higher temperature than 657° C. being the liquidus line temperature of the aluminum alloy by 243° C.). In this comparative example, the molten aluminum alloy reacted with the mold to be strongly bonded thereto, so that it was not possible to remove the article from the mold.

COMPARATIVE EXAMPLE 6

A metal/ceramic bonding article was produced by the same method as that in Example 1, except that the mean cooling rate was 3° C./minute. After the same evaluation as that in Example 1 was carried out with respect to the produced article, the warpage of the aluminum alloy base plate in longitudinal directions was 0.2 mm, and the mean crystal grain size on the surface of the aluminum alloy plate for circuit pattern was 0.7 to 1.0 mm. In addition, the amount of the coarse deposits remaining on the surface of the ceramic substrate after etching was large, and plating deposited on the remaining deposits, so that the withstand voltage between the circuit patterns was lowered to 1.2 kV.

COMPARATIVE EXAMPLE 7

A metal/ceramic bonding article was produced by the same method as that in Example 1, except that the mean cooling rate was 110° C./minute. After the same evaluation as that in Example 1 was carried out with respect to the produced article, the warpage of the aluminum alloy base plate in longitudinal directions exceeded 0.6 mm, and the etching resist was not suitably printed by the screen printing machine. Therefore, an etching resist was formed by the pad printing to carry out etching, and the same heat cycle test as that in Example 1 was carried out, so that fine cracks were produced in the ceramic substrate after 600 cycles.

COMPARATIVE EXAMPLE 8

A metal/ceramic bonding article was produced by the same method as that in Example 1, except that the temperature gradient during the cooling of the molten aluminum alloy was 0.3° C./cm. After the same evaluation as that in Example 1 was carried out with respect to the produced article, the same results as those in Example 1 were obtained, except that a plurality of voids having a diameter of 2 mm or less were produced in the aluminum alloy base plate. If such voids are produced, the heat sink characteristic of the base plate is deteriorated, so that the use of the base plate is limited.

COMPARATIVE EXAMPLE 9

A metal/ceramic bonding article was produced by the same method as that in Example 1, except that the temperature gradient during the cooling of the molten aluminum alloy was 60° C./cm. After the same evaluation as that in Example 1 was carried out with respect to the produced article, the mean crystal grain size on the surface of the aluminum alloy plate for circuit pattern was 0.2 to 1.0 mm, and coarse crystal grains (having a length of 20 to 40 mm) extending in heat flow directions during cooling were formed. The same heat cycle test as that in Example 1 was carried out, so that large corrugations were produced in the coarse crystal grain portion of the aluminum alloy circuit plate after 1000 cycles. If the metal/ceramic bonding substrate is used as a circuit board, there is some possibility that the corrugations deteriorate the reliability of the circuit board due to the soldering of semiconductor chips or the like.

COMPARATIVE EXAMPLE 10

A metal/ceramic bonding article was produced by the same method as that in Example 1, except that the molten aluminum alloy was cooled and solidified by causing the surface of the mold on the side of the inlet to contact the cooling block while pressurizing the molten aluminum alloy from the low-temperature side to the high-temperature side. After the same evaluation as that in Example 1 was carried out with the produced article, the same results as those in Example 1 were obtained, except that the cross section of each of the corner portions of the aluminum alloy base plate on the high-temperature side had R=1.0 to 1.5 mm. If the cross section of each of the corner portions of the aluminum alloy base plate exceeds R=1.0 mm, the alignment and sealing performance of a casing mounted on the aluminum alloy base plate are deteriorated, so that there are problems in practice.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a metal/ceramic bonding substrate, the method comprising the steps of:
    setting a ceramic substrate in a porous carbon mold having an inlet;
    injecting a molten metal of aluminum or an aluminum alloy into the mold from the inlet so as to allow the molten metal to contact the ceramic substrate;
    cooling the opposite side of the mold to the inlet to form a temperature gradient of 1 to 50° C./cm in the mold to cool and solidify the molten metal to bond one side of a metal plate of aluminum or the aluminum alloy to one side of the ceramic substrate, the molten metal being cooled at a mean cooling rate of 5 to 100° C./minute when the molten metal is cooled from the liquidus line temperature of the molten metal to 450° C.; and blowing a gas into the inlet or an opening, which is formed in the mold, when the molten metal is cooled and solidified, for causing the molten metal to reach end portions in the mold by allowing the gas to pass through the mold while preventing the molten metal from passing through the mold, said gas being blown so as to pressurize the molten metal from the inlet side toward the opposite side in the mold at a pressure of 1.0 to 100 kPa.

2. A method for producing a metal/ceramic bonding substrate as set forth in claim 1, wherein the molten metal is solidified by cooling the opposite side of the mold to form a high-temperature side and a low-temperature side in the mold and by cooling the mold while the molten metal injected into the mold is pressurized from the high-temperature side to the low-temperature side.

3. A method for producing a metal/ceramic bonding substrate as set forth in claim 1, wherein the molten metal is solidified by cooling the mold so that the inlet side in the mold is a high-temperature side and the opposite side in the mold to the inlet is a low-temperature side, the temperature on which is lower than that on the high-temperature side, and by cooling the mold while the molten metal injected into the mold is pressurized from the high-temperature side to the low-temperature side.

4. A method for producing a metal/ceramic bonding substrate as set forth in claim 1, wherein the molten metal injected into the mold has a temperature which is higher than the liquidus line temperature of the molten m by 5 to 200° C.

5. A method for producing a metal/ceramic bonding substrate as set forth in claim 1, which further comprises a step of heating the mold so that the difference between the temperature of the mold and the temperature of the molten metal is not higher than 250° C., before injecting the molten metal into the mold.

6. A method for producing a metal/ceramic bonding substrate as set forth in claim 1, wherein said aluminum alloy contains silicon.

7. A method for producing a metal/ceramic bonding substrate as set forth in claim 1, wherein said opposite side of the mold is caused to contact a cooling block.

8. A method for producing a metal/ceramic bonding substrate as set forth in claim 7, wherein said cooling block is a water-cooling jacket.

9. A method for producing a metal/ceramic bonding substrate as set forth in claim 1, wherein said temperature gradient is formed by changing the contact area of a cooling block with the mold.

* * * * *